(12) United States Patent
Goeke

(10) Patent No.: US 7,388,366 B2
(45) Date of Patent: Jun. 17, 2008

(54) TEST SYSTEM CONNECTION SYSTEM WITH TRIAXIAL CABLES

(75) Inventor: Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 86 days.

(21) Appl. No.: 11/347,617

(22) Filed: Feb. 3, 2006

(65) Prior Publication Data

US 2007/0182429 A1 Aug. 9, 2007

(51) Int. Cl.
*G01R 31/02* (2006.01)

(52) U.S. Cl. .................. 324/158.1; 324/754

(58) Field of Classification Search ........... 324/158.1, 324/649, 765, 73.1; 333/12, 134; 307/89
See application file for complete search history.

(56) References Cited

U.S. PATENT DOCUMENTS

| | | | | |
|---|---|---|---|---|
| 5,345,182 A | * | 9/1994 | Wakamatsu | 324/649 |
| 5,418,506 A | * | 5/1995 | Mahnad | 333/134 |
| 6,998,869 B2 | * | 2/2006 | Tanida et al. | 324/765 |
| 7,068,060 B2 | * | 6/2006 | Iwasaki | 324/765 |
| 7,098,647 B2 | * | 8/2006 | Tanaka et al. | 324/158.1 |

* cited by examiner

Primary Examiner—Vinh P Nguyen
(74) Attorney, Agent, or Firm—Pearne & Gordon LLP

(57) ABSTRACT

A connection system for connecting test equipment to a device under test (DUT) includes a first pair of equal-length triaxial cables, each having a desired characteristic impedance between a center conductor and an outer conductor, the outer conductor of each first cable being connected to each other at respective proximal and distal ends of the first cables, the distal end of each first cable center conductor being connected to each other, and the distal end of each of a first cable intermediate conductor being connected to each other; and a second pair of equal-length triaxial cables, each having the desired characteristic impedance between a center conductor and an outer conductor, the outer conductor of each second cable being connected to each other at respective proximal and distal ends of the second cables as well as to the respective proximal and distal ends of the outer conductors of the first cables, the distal end of each second cable center conductor being connected to each other, and the distal end of each of a second cable intermediate conductor being connected to each other, wherein four-wire measurements are made using each of the triaxial cables individually and two-wire measurements are made using each pair of cables in parallel thereby providing a characteristic impedance equal to the desired characteristic impedance, the DUT being locatable at the distal end of the cables.

10 Claims, 8 Drawing Sheets

TEST SYSTEM CONNECTION SYSTEM WITH TRIAXIAL CABLES

BACKGROUND OF THE INVENTION

The present invention relates to electrical test instruments and, in particular, to interconnections between test instruments and devices under test.

It has become common to perform multiple automatic tests in multiple regimes on semiconductor devices on a wafer, as well as at later points in a device's life, including in its final product.

Examples of common tests are IV measurements, CV measurements, general radio frequency (RF) measurements and vector network analyzers. Increasing, there is a demand for all of these tests to be not only as accurate as possible, but also to be performed as quickly and efficiently as possible. Unfortunately, besides the obvious differences in the test instrument configurations themselves used in the different tests, there also is presently a requirement to either change the cabling to the same test pins contacting the device under test (DUT) or to relocate the test connection using different pins.

In IV testing (a four-wire measurement), it is common to use two pairs of triaxial cables (each cable having an outer, intermediate and center connector) between the test instruments and two pins at the DUT. At the DUT (distal) end, the center conductors of a first pair of cables are connected to one pin and the center conductors of a second pair of cables is connected to the second pin. In general, the closer to the DUT that the conductors are connected together, the better, but mechanical constraints may force compromises. The two intermediate conductors of each pair are typically also connected together at the distal end. In operation, the intermediate conductors are then typically supplied with a guard voltage corresponding to the voltage on the respective center conductors. The outer conductors of the triaxial cables are typically just connected to a protective ground as the guard and center conductor voltages may be at a high potential. The test is basically DC and transmission line (distributed parameters) behavior is not typically a consideration.

In CV testing (a four-wire measurement), it is common to use two pairs of two-conductor coaxial cables between the test instruments and two pins at the DUT. At the distal end, the center conductors of a first pair of cables are connected to one pin and the center conductors of a second pair of cables is connected to the second pin. In general, the closer to the DUT that the conductors are connected together, the better, but mechanical constraints may force compromises. The outer conductors of the cables are typically connected to an instrument ground. This test is AC in nature, so transmission line (distributed parameters) behavior is typically a consideration. The two-conductor coaxial cables have a characteristic impedance, for example, 50 ohms. In addition, the test instruments and DUT terminations will typically have the same characteristic impedance.

In more general RF testing (a two-wire measurement), as well as vector network analyzers, it is common to use two two-conductor coaxial cables between the test instrument and two pins at the DUT. At the distal end, each center conductor is attached to a respective pin at the DUT. The outer conductors of the cable are typically connected to a ground. These tests are also AC in nature, so transmission line (distributed parameters) behavior is typically a consideration. The two-conductor coaxial cables have a characteristic impedance, for example, 50 ohms. In addition, the test instrument and DUT terminations will typically have the same characteristic impedance.

To perform the three types of tests above, it is typical to require three different cabling schemes as discussed above. Present solutions are to use different test pins for each test or to recable for each test. Using different test pins increases the number of operations needed for the tests and the time to perform the tests. In a further complication, it is possible to ameliorate some of the overhead required to recable by locating cable selecting switches near the DUT. This introduces additional mechanical constraints, measurement errors, calibration difficulties, costs and control issues.

SUMMARY OF THE INVENTION

A connection system for connecting test equipment to a device under test (DUT) includes a first pair of equal-length triaxial cables, each having a desired characteristic impedance between a center conductor and an outer conductor, the outer conductor of each first cable being connected to each other at respective proximal and distal ends of the first cables, the distal end of each first cable center conductor being connected to each other, and the distal end of each of a first cable intermediate conductor being connected to each other; and a second pair of equal-length triaxial cables, each having the desired characteristic impedance between a center conductor and an outer conductor, the outer conductor of each second cable being connected to each other at respective proximal and distal ends of the second cables as well as to the respective proximal and distal ends of the outer conductors of the first cables, the distal end of each second cable center conductor being connected to each other, and the distal end of each of a second cable intermediate conductor being connected to each other, wherein four-wire measurements are made using each of the triaxial cables individually and two-wire measurements are made using each pair of cables in parallel thereby providing a characteristic impedance equal to the desired characteristic impedance, the DUT being locatable at the distal end of the cables.

DESCRIPTION OF THE PREFERRED EMBODIMENTS

Figure 1:
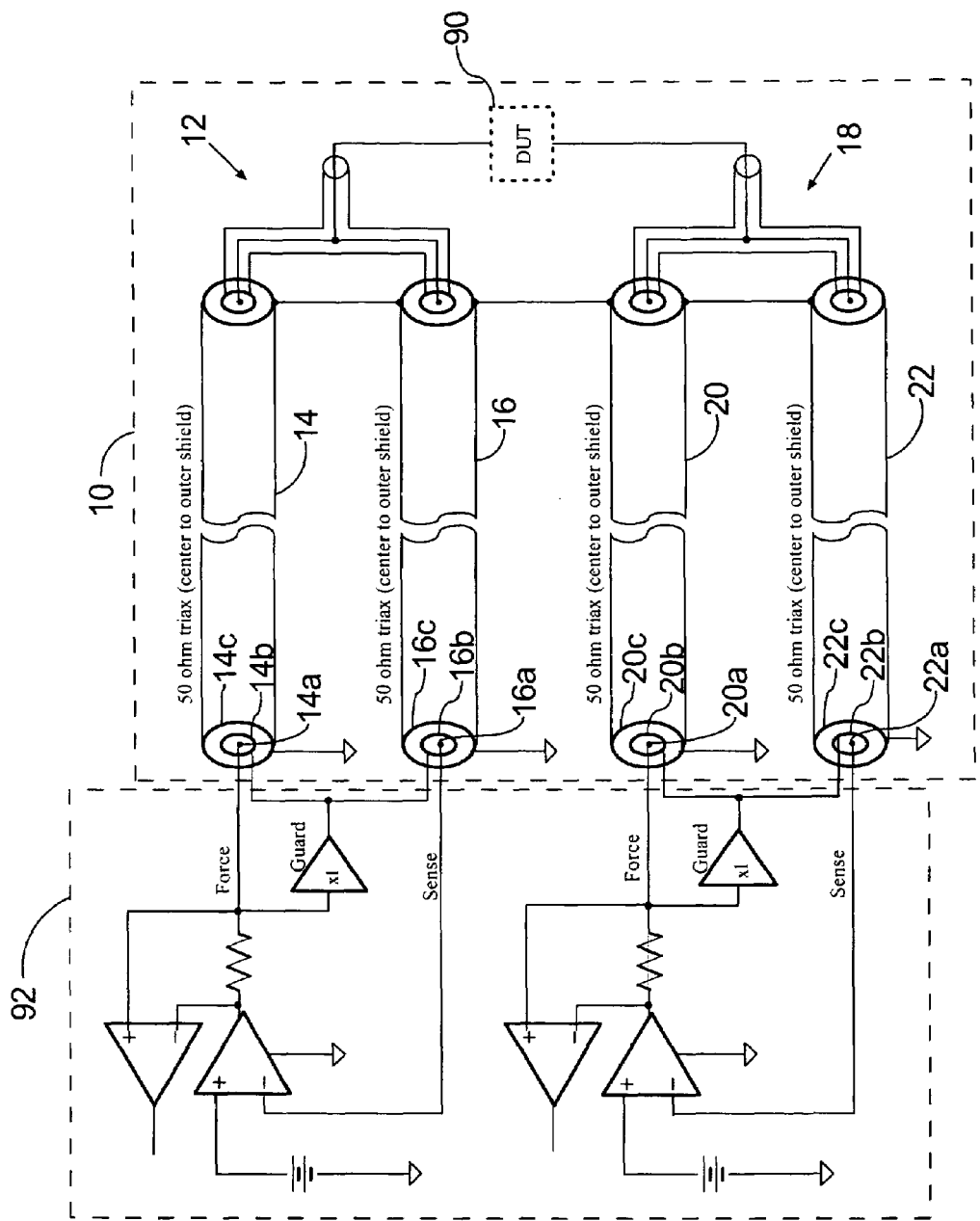
FIG. 1 is a schematic diagram of an example of a connection system according to the invention in use to perform a four-wire IV measurement.

Referring to FIG. 1, a connection system 10 connects a DUT 90 to test instruments 92 suitable for performing an IV test (a DC four-wire test) on the DUT 90.

The connection system 10 includes a first pair 12 of triaxial cables 14, 16 and second pair 18 of triaxial cables 20, 22. Each cable 14, 16, 20, 22 has a center conductor 14a, 16a, 20a, 22a, an intermediate conductor 14b, 16b, 20b, 22b and an outer conductor 14c, 16c, 20c, 22c, respectively. The distal ends of the cable pairs 12, 18 are located near the DUT 90 and the proximal ends are located at the instruments 92. Unusual for triaxial cable used in IV testing (basically a DC measurement), the cables 14, 16, 20, 22 have a characteristic impedance between the outer conductor and the center conductor that corresponds to a desired characteristic impedance for AC measurements, for example, 50 or 100 ohms. In addition, the cables of each pair 12, 18 is of equal length.

The outer conductors 14c, 16c, 20c, 22c of the cables are connected together at both the distal and proximal ends. The intermediate conductors 14b, 16b of the first pair 12 are connected together at the distal end and the intermediate conductors 20b, 22b of the second pair 18 are connected together at the distal end. Similarly, the center conductors 14a, 16a of the first pair 12 are connected together at the distal end and the center conductors 20a, 22a of the second pair 18 are connected together at the distal end.

At the proximal end of the system 10, the conductors are connected in a manner suitable for an IV test, i.e., the center conductors of each pair are connected to a respective force and sense terminal on the instruments 92 and the intermediate conductors are connected to a respective guard potential to improve the integrity of the measurements made with the center conductors.

It is important to note that at the DUT, many similar connection systems may be converging into a very restricted space.

Figure 2:
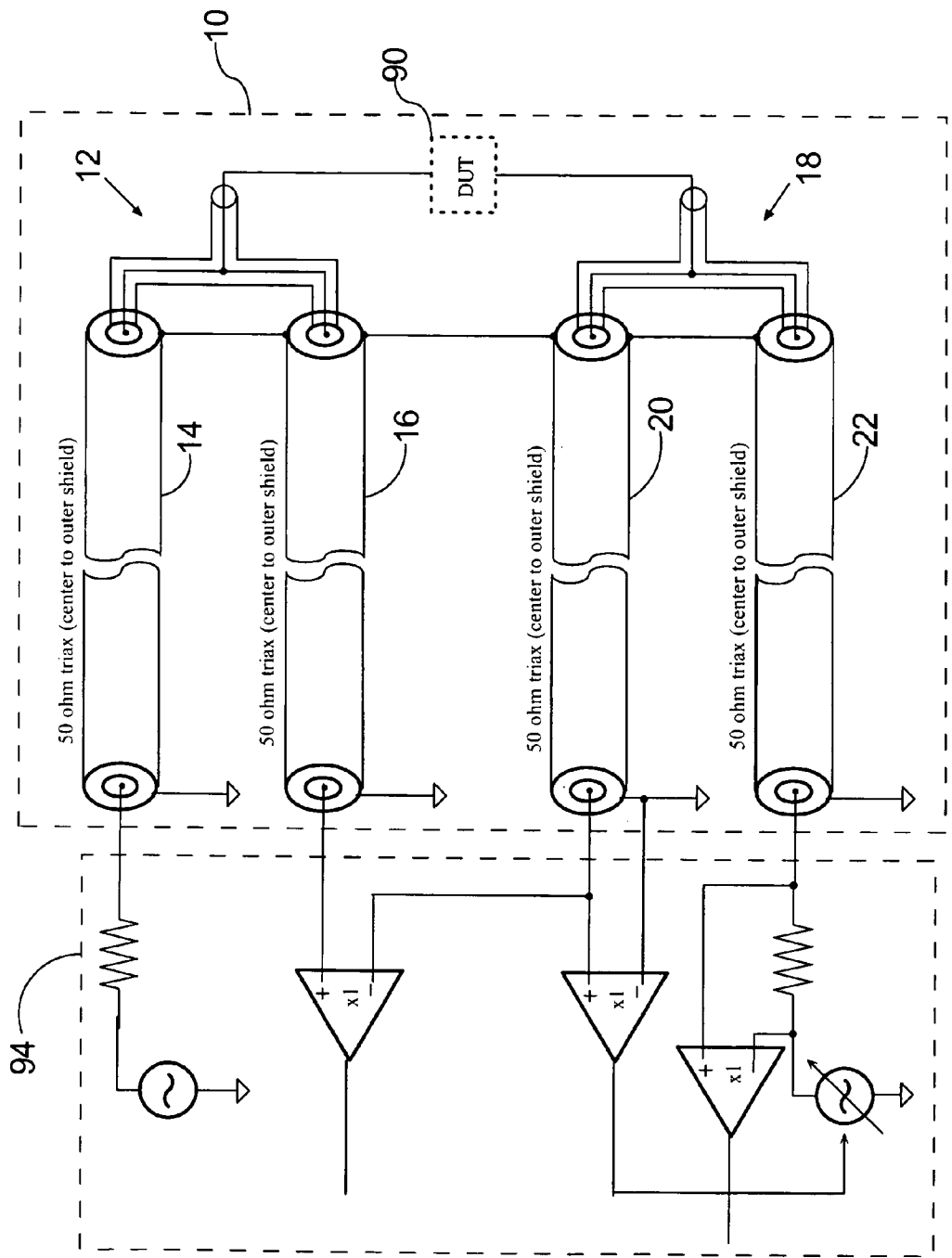
FIG. 2 is a schematic diagram of an example of a connection system according to the invention in use to perform a four-wire CV measurement.

Referring to FIG. 2, the connection system 10 (same as above) connects a DUT 90 to test instruments 94 suitable for performing a CV test (an AC four-wire test) on the DUT 90.

At the proximal end of the system 10, the conductors are connected in a manner suitable for a CV test, i.e., the center conductors of each pair are connected to a respective driver and measuring terminal on the instruments 92 and the outer conductors provide a shield for the AC signals involved. Now the characteristic impedance between the center conductors and the outer conductors of the cables comes into play, with impedance matching being important to minimize reflections and phase disturbances.

It is important to note that the distal arrangement of the system 10 remains unchanged, only the connections/instruments at the proximal end are changed. At the proximal end, there will typically be few constraints on available space. This allows the efficient and convenient use of switches and the like to automate the selection of tests, instruments and proximal connections in a space where the focus can be on performance with little regard for mechanical and physical space limitations as exist at the distal end. Such switching arrangements are beyond the scope of the present invention.

Figure 3:
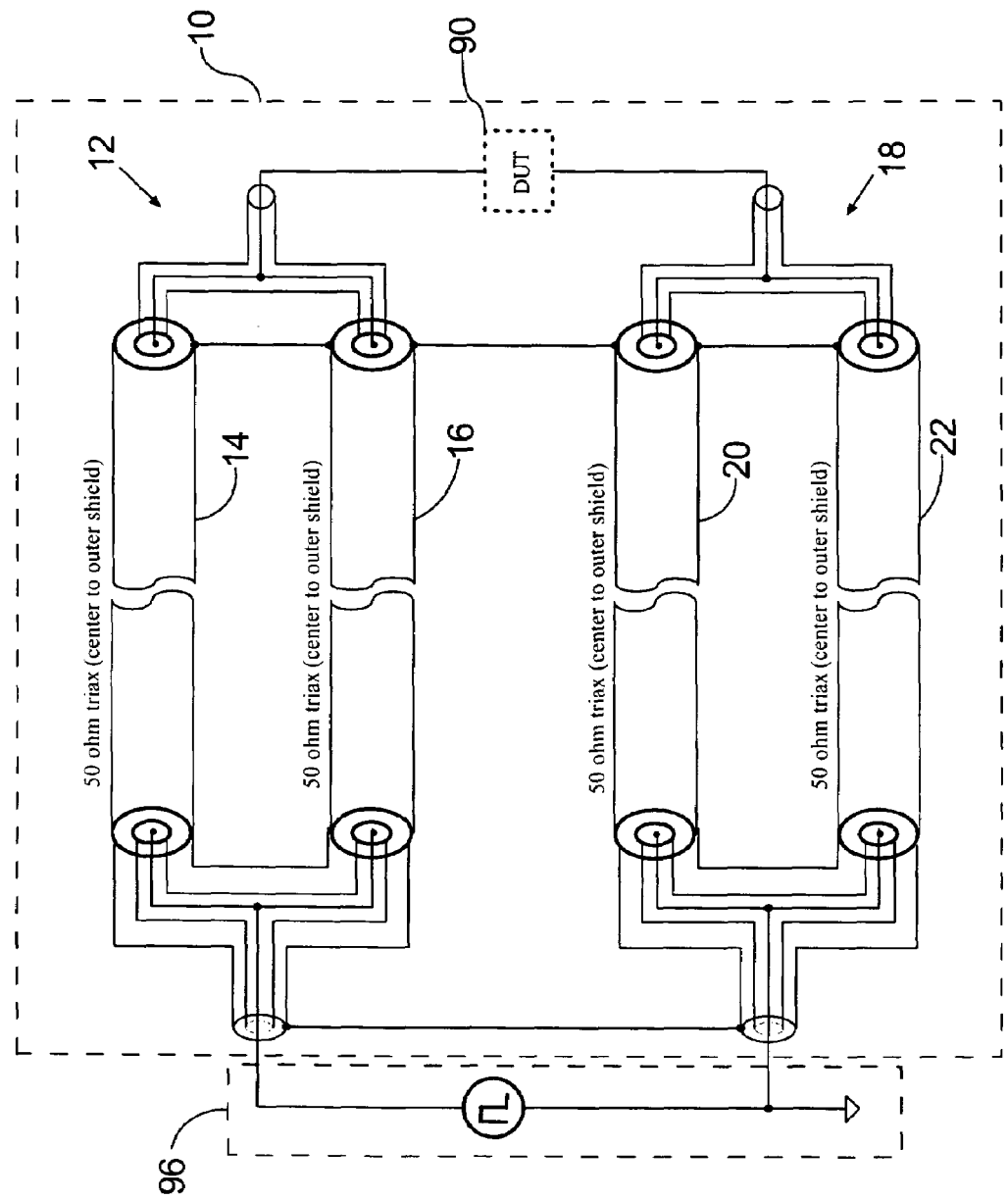
FIG. 3 is a schematic diagram of an example of a connection system according to the invention in use to perform a two-wire RF measurement.

Referring to FIG. 3, the connection system 10 (same as above) connects a DUT 90 to a test instrument 96 suitable for performing a two-wire RF test on the DUT 90.

At the proximal end of the system 10, the conductors are connected in a manner suitable for a RF test. At first impression, it might appear that for a two-wire test, only two of the four cables would be used. However, because all four cables are connected at the distal end, using only two cables would result in reflections and impedance mismatches. Instead, each cable in a pair is operated in parallel with the other cable in a pair.

For example, if each of the cables 14, 16, 20, 22 has a characteristic impedance of 50 ohms between the outer conductor and the center conductor, then the pair 12 and the pair 18 each have a characteristic impedance of 25 ohms. However, the pairs 12, 18 are operated in series with the DUT 90 and the instrument 96, resulting in the instrument 96 (which itself would typically have a 50 ohm impedance) seeing a 50 ohm characteristic impedance from the connection system 10. This arrangement thus minimizes issues of reflections and impedance mismatches.

It is also possible to use other characteristic impedance values, for example, 100 ohms.

Figure 4:
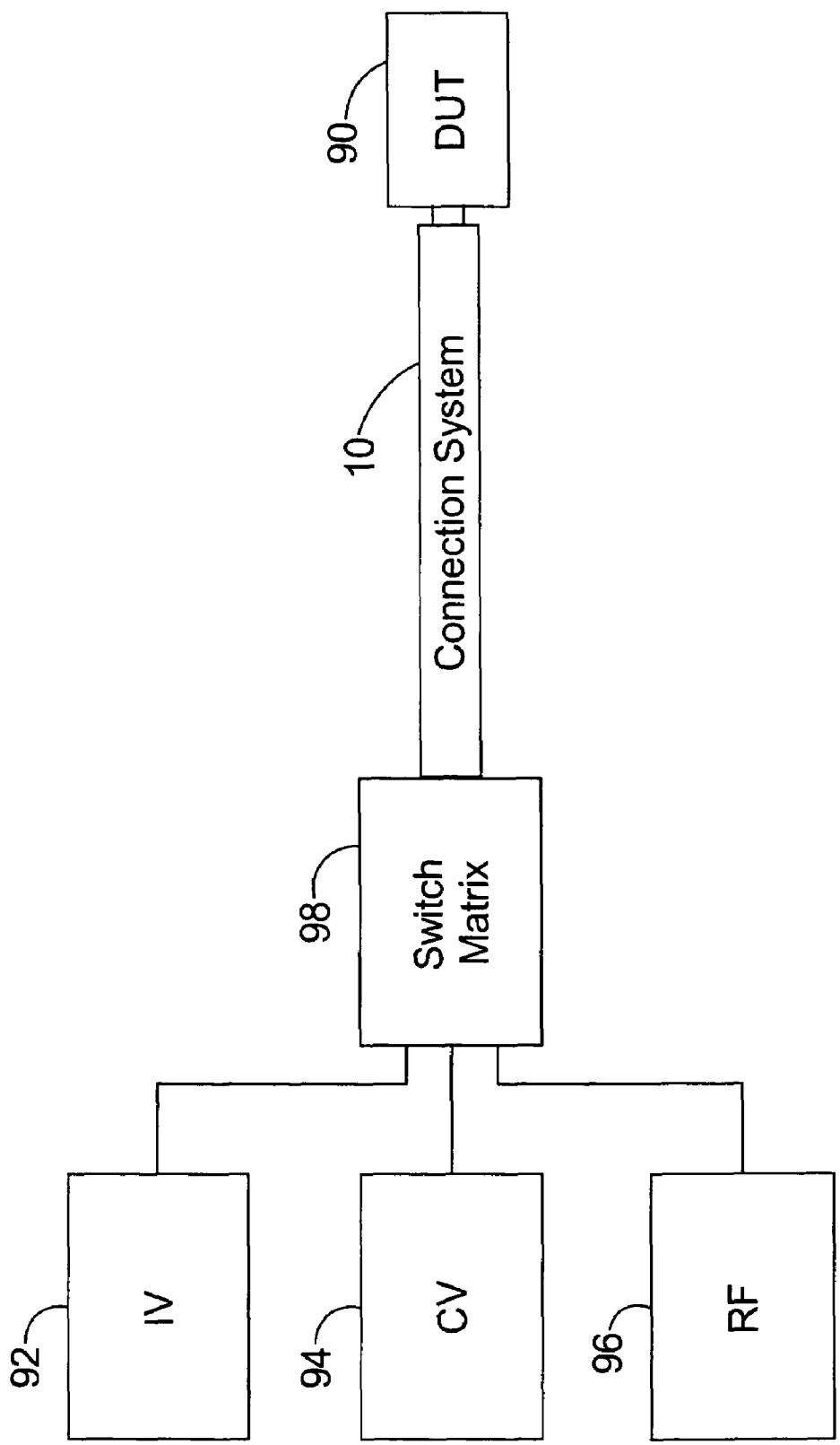
FIG. 4 is a block diagram of a testing station incorporating a connection system according to the invention.

As can be seen from the examples above, the connection system 10 uses identical distal connections for all of the testing configurations. This is in spite of the fact that the instrument configurations and the proximal connections are substantially different. The connection system 10 moves the recabling issues away from the DUT 90 to the proximal end of the connection system 10 where ample room exists for any desired cable switching apparatus. This allows the use of the same test pins and the same cabling to be used for any of the tests. For example, a testing station may be configured as shown in FIG. 4, where a computer-controlled switching matrix 98 allows any of the tests to be automatically performed. This capability is particularly important if many pairs of test pins are all being used on a DUT at a given time. It such case, it is often difficult just getting all of the cabling to the pins, much less trying to provide cable switching apparatus in such a constrained space.

It should be noted that additional inner or outer conductors may be added to the triaxial cables of the invention without departing from the scope of the invention. In addition, in some cases, it may be desirable to substitute for an actual connection, a "virtual connection" where active circuitry is used to dynamically force the "connected" points to have the same voltage and/or current.

Figure 5:
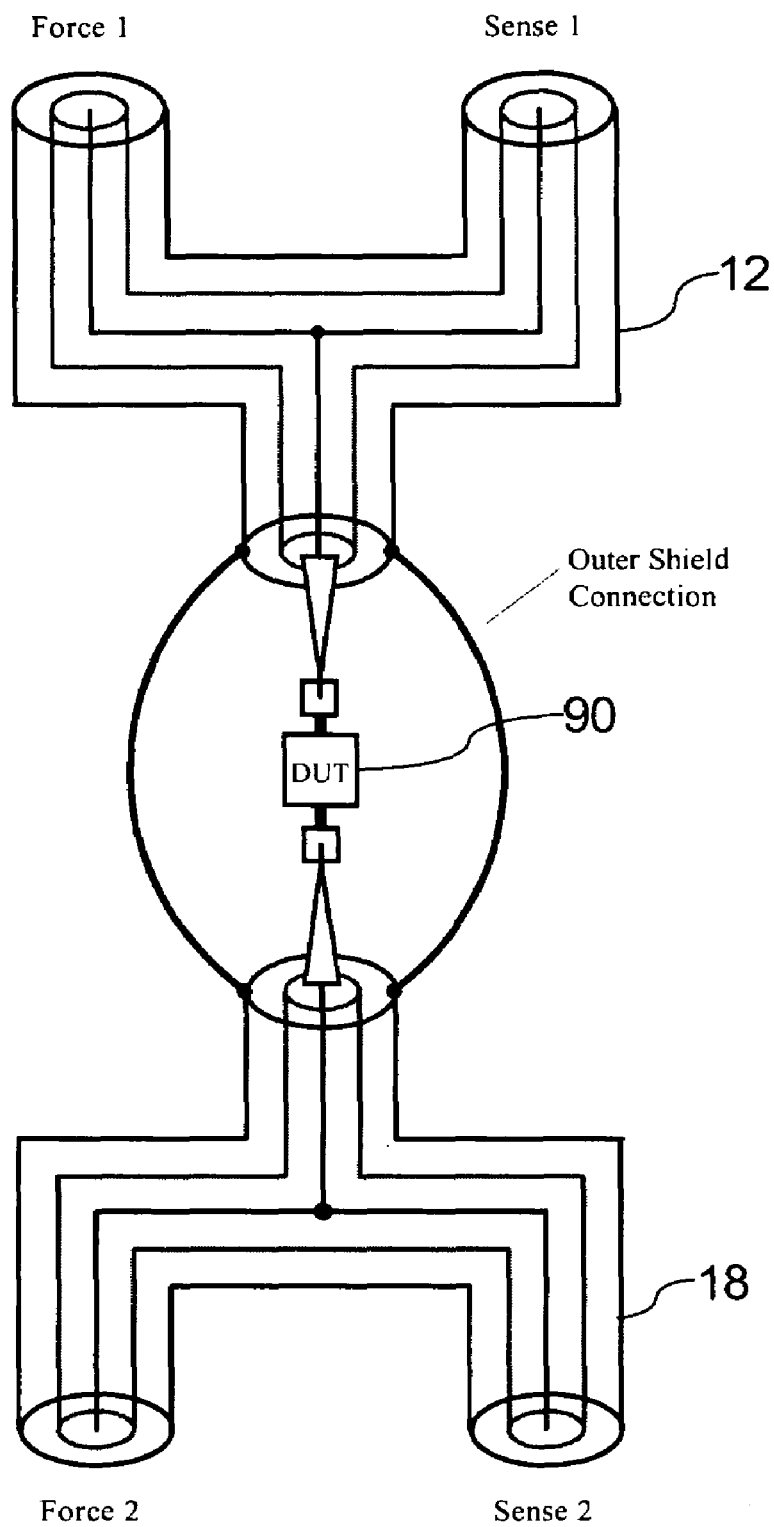
FIG. 5 is a schematic diagram of an example of the distal end of a connection system according to the invention.

Referring to FIG. 5, an example of the distal end of the connection system 10 is shown connected to the DUT 90.

Figure 6:
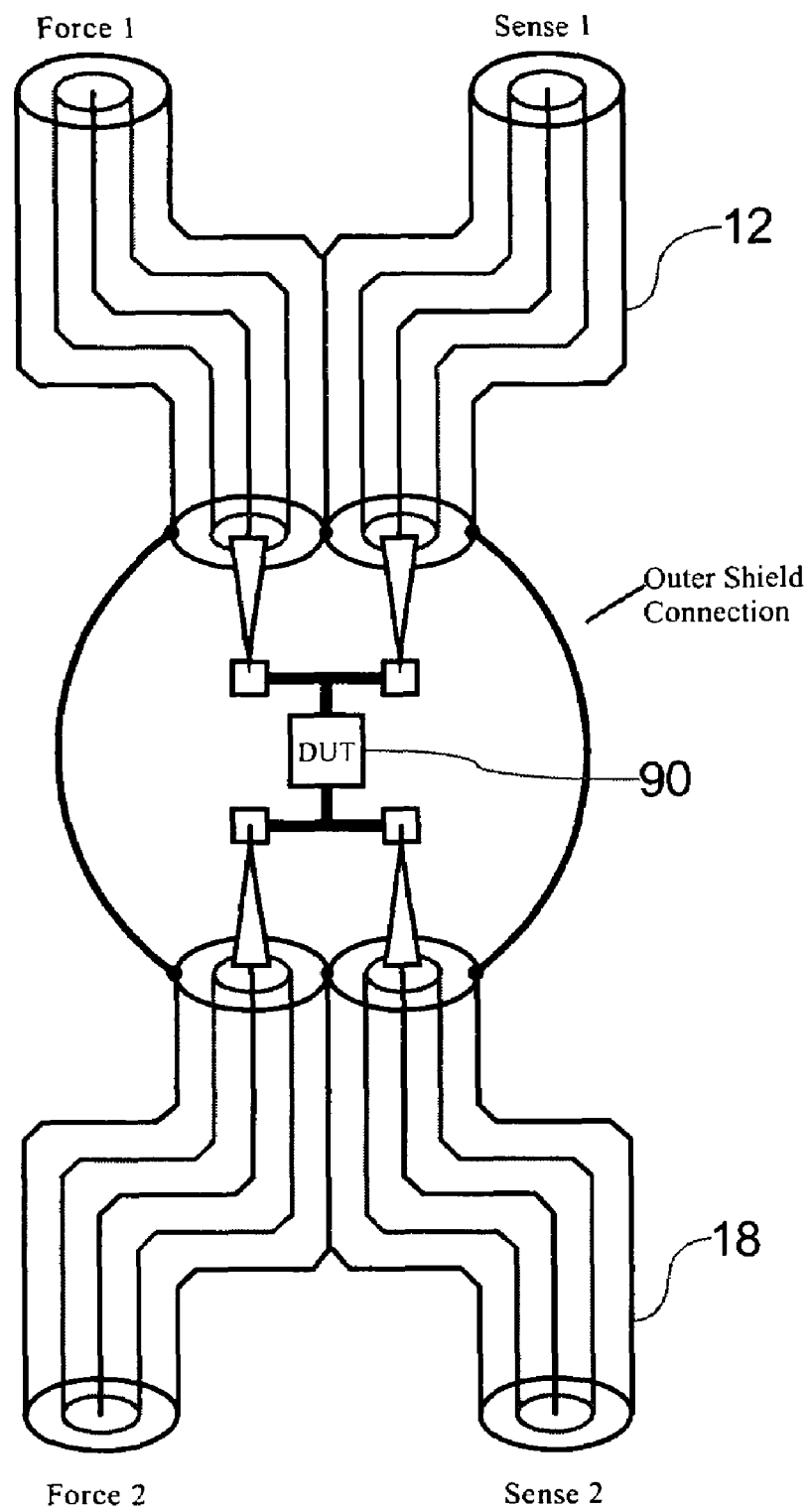
FIG. 6 is a schematic diagram of another example of the distal end of a connection system according to the invention.

Referring to FIG. 6, another example of the distal end of the connection system 10 is shown connected to the DUT 90. In this example, the connection between the first pair of center conductors 14, 16 and the connection between the second pair of center conductors 20, 22 have been moved closer to DUT 90 (i.e., onto the DUT itself, or at least its carrier).

Figure 7:
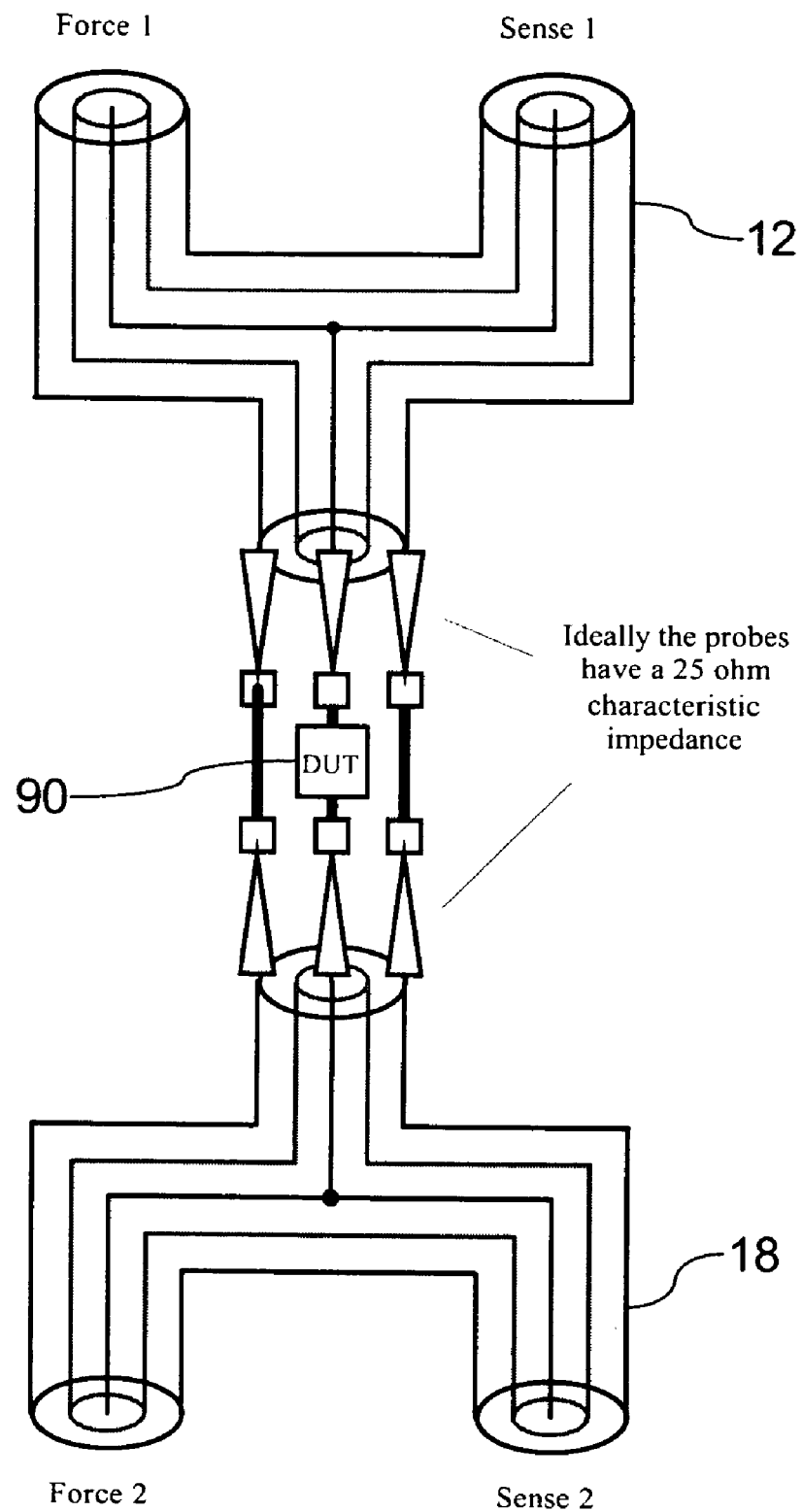
FIG. 7 is a schematic diagram of still another example of the distal end of a connection system according to the invention.

Referring to FIG. 7, still another example of the distal end of the connection system 10 is shown connected to the DUT 90. In this example, the characteristic impedance is maintained across the DUT 90 (which is half the desired characteristic impedance, e.g., 25 ohms).

Figure 8:
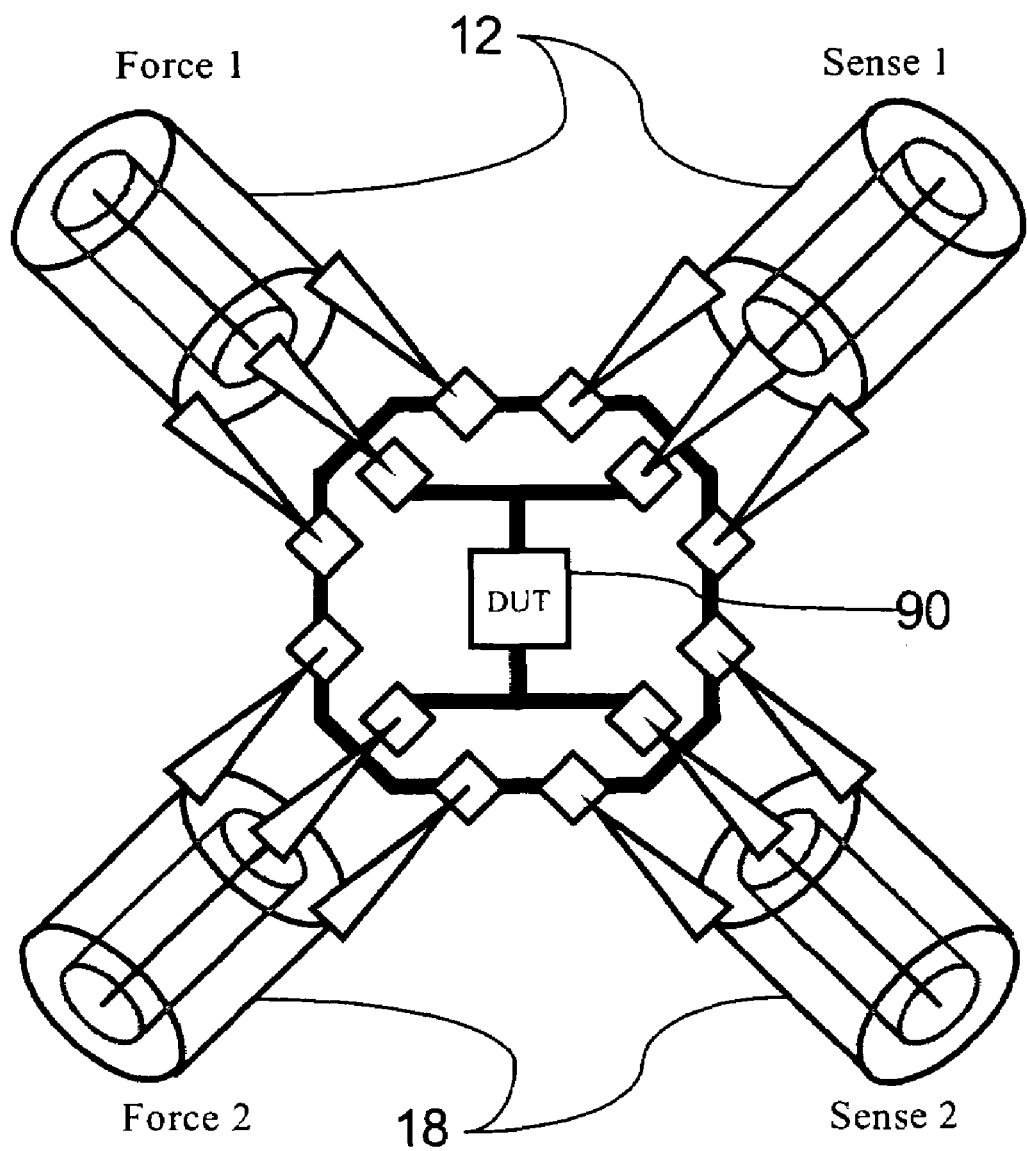
FIG. 8 is a schematic diagram of a further example of the distal end of a connection system according to the invention.

Referring to FIG. 8, a further example of the distal end of the connection system 10 is shown connected to the DUT 90. In this example, both the inner conductor and the outer conductor connections of the system 10 have been moved closer to the DUT 90.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A connection system for connecting test equipment to a device under test (DUT), said system comprising;

a first pair of equal-length triaxial cables, each having a desired characteristic impedance between a center conductor and an outer conductor, the outer conductor of each first cable being connected to each other at respective proximal and distal ends of said first cables, the distal end of each first cable center conductor being connected to each other, and the distal end of each of a first cable intermediate conductor being connected to each other; and a second pair of equal-length triaxial cables, each having said desired characteristic impedance between a center conductor and an outer conductor, the outer conductor of each second cable being connected to each other at respective proximal and distal ends of said second cables as well as to the respective proximal and distal ends of the outer conductors of the first cables, the distal end of each second cable center conductor being connected to each other, and the distal end of each of a second cable intermediate conductor being connected to each other, wherein four-wire measurements are made using each of said triaxial cables individually and two-wire measurements are made using each pair of cables in parallel thereby providing a characteristic impedance equal to said desired characteristic impedance, said DUT being locatable at the distal end of said cables.

2. A system according to claim 1, wherein at least some of said distal outer conductor connections are made on the DUT carrier.

3. A system according to claim 1, wherein said desired characteristic impedance is 50 or 100 ohms.

4. A system according to claim 1, wherein the characteristic impedance across the DUT is one-half of said desired characteristic impedance.

5. A system according to claim 4, wherein said desired characteristic impedance is 50 or 100 ohms.

6. A system according to claim 4, wherein said desired characteristic impedance is 50 or 100 ohms.

7. A system according to claim 1, wherein at least some of said distal outer conductor connections are made on the DUT carrier.

8. A system according to claim 1, wherein said desired characteristic impedance is 50 or 100 ohms.

9. A system according to claim 1, wherein the characteristic impedance across the DUT is one-half of said desired characteristic impedance.

10. A connection system for connecting test equipment to a device under test (DUT), said system comprising;

a first pair of equal-length triaxial cables, each having a desired characteristic impedance between a center conductor and an outer conductor, the outer conductor of each first cable being connected to each other at respective proximal and distal ends of said first cables, the distal end of each first cable center conductor being connected to each other, and the distal end of each of a first cable intermediate conductor being connected to each other; and a second pair of equal-length triaxial cables, each having said desired characteristic impedance between a center conductor and an outer conductor, the outer conductor of each second cable being connected to each other at respective proximal and distal ends of said second cables as well as to the respective proximal and distal ends of the outer conductors of the first cables, the distal end of each second cable center conductor being connected to each other, and the distal end of each of a second cable intermediate conductor being connected to each other, wherein each of said pair of cables in parallel has a characteristic impedance equal to said desired characteristic impedance, said DUT being locatable at the distal end of said cables.

* * * * *